US012097782B2

United States Patent
Taniguchi et al.

(10) Patent No.: US 12,097,782 B2
(45) Date of Patent: Sep. 24, 2024

(54) BATTERY MANAGEMENT DEVICE

(71) Applicants: Hino Motors, Ltd., Tokyo (JP);
TOYOTA JIDOSHA KABUSHIKI KAISHA, Toyota (JP)

(72) Inventors: Koichiro Taniguchi, Hino (JP);
Minoru Kowada, Hino (JP); Jun Namima, Hino (JP); Yu Yaguchi, Hino (JP); Shin Mizoroki, Hino (JP)

(73) Assignees: Hino Motors, Ltd., Tokyo (JP);
TOYOTA .JIDOSHA KABUSHIKI. KAISHA, Toyota (JP)

( * ) Notice: Subject to any disclaimer, the term of this patent is extended or adjusted under 35 U.S.C. 154(b) by 288 days.

(21) Appl. No.: 17/840,066

(22) Filed: Jun. 14, 2022

(65) Prior Publication Data

US 2022/0402400 A1    Dec. 22, 2022

(30) Foreign Application Priority Data

Jun. 16, 2021   (JP) .................. 2021-100467

(51) Int. Cl.
*B60L 53/00* (2019.01)
*B60L 53/62* (2019.01)
(Continued)

(52) U.S. Cl.
CPC ............. *B60L 58/13* (2019.02); *B60L 53/62* (2019.02); *B60L 58/40* (2019.02); *H02J 7/0048* (2020.01); *H02J 7/14* (2013.01); *H02J 2310/48* (2020.01)

(58) Field of Classification Search
CPC .......... B60L 58/13; B60L 53/62; B60L 58/40; B60L 50/75; B60L 50/70; B60L 58/12;
(Continued)

(56) References Cited

U.S. PATENT DOCUMENTS 6,608,482 B2    8/2003  Sakai et al.
8,615,372 B2 *  12/2013 Tomura .................. H01M 10/48
                                              702/63
(Continued)

FOREIGN PATENT DOCUMENTS

JP    2001-231108 A    8/2001
JP    2002-45072 A     2/2002
(Continued)

OTHER PUBLICATIONS

Extended European Search Report issued Nov. 28, 2022 in European Patent Application No. 22179282.3, 7 pages.

*Primary Examiner* — Ian Jen
(74) *Attorney, Agent, or Firm* — Oblon, McClelland, Maier & Neustadt, L.L.P.

(57) ABSTRACT

A battery management device includes: a first switch state acquisition unit configured to acquire the state of an ignition switch; a determination unit configured to determine to perform correction control for correcting an error in the state of charge (SOC) of the battery when the ignition switch is operated from ON to OFF; a correction control unit configured to perform the correction control of the SOC of the battery when it is determined that the correction control is to be performed; and a second switch state acquisition unit configured to acquire the state of a cancel switch for canceling the execution of the correction control. When the ignition switch is operated from ON to OFF while the cancel switch is ON, the determination unit determines that the correction control is not to be performed.

12 Claims, 3 Drawing Sheets

(51) Int. Cl.
*B60L 58/13* (2019.01)
*B60L 58/40* (2019.01)
*H02J 7/00* (2006.01)
*H02J 7/14* (2006.01)

(58) Field of Classification Search
CPC . B60L 58/26; H02J 7/0048; H02J 7/14; H02J 2310/48; H02J 7/0049; Y02T 10/70; G01R 31/374; B60Q 9/00
See application file for complete search history.

(56) References Cited

U.S. PATENT DOCUMENTS

| | | | |
|---|---|---|---|
| 10,603,997 B2 * | 3/2020 | Bergstrom | ............. B60K 16/00 |
| 2002/0113595 A1 | 8/2002 | Sakai et al. | |
| 2007/0139013 A1 | 6/2007 | Seo et al. | |
| 2020/0254864 A1 * | 8/2020 | Bergstrom | ............. B60L 50/64 |
| 2020/0355748 A1 | 11/2020 | Akaishi | |

FOREIGN PATENT DOCUMENTS

| | | |
|---|---|---|
| JP | 2007-128778 A | 5/2007 |
| JP | 2014-201175 A | 10/2014 |
| KR | 10-0669476 B1 | 1/2007 |
| WO | WO 2018/181489 A1 | 10/2018 |

* cited by examiner

BATTERY MANAGEMENT DEVICE

TECHNICAL FIELD

The present disclosure relates to a battery management device for managing a battery of an electric vehicle. This application claims the benefit of foreign priority to Japanese Patent Application No. JP2021-100467, filed Jun. 16, 2021, which is incorporated by reference in its entirety.

BACKGROUND

There is an electric vehicle including a generator, a battery, and a motor operated by the output power of the generator and/or the battery. As a method of managing the state of charge (SOC) of the battery, for example, there is a current integration method. However, in the current integration method, an error in the estimated value of the SOC is accumulated due to the current measurement error during charging and discharging. In order to correct this error, a method of correcting the SOC by referring to the voltage value of the battery is known. In this method, the SOC error is corrected by controlling the charging and discharging of the battery so that the SOC value is within the range where the amount of change in the voltage value with respect to the amount of change in the SOC is large and acquiring the SOC value corresponding to the voltage value. For example, in a lithium-ion battery using lithium iron phosphate, the amount of change in the voltage value with respect to the amount of change in the SOC is very small when the SOC is not near 0% and 100%. For this reason, control for error correction is performed so that the SOC is close to 0% or 100%. For example, Patent Literature 1 (International Publication WO 2018/181489) describes that the battery is charged until the battery is fully charged to correct an error in the estimated value of the SOC.

Correction control to correct the SOC value by fully charging the battery so that the SOC is close to 100% is performed, for example, when the ignition switch is turned off in order to end the driving of the electric vehicle. During the correction control, noise is generated by the power generation operation of the generator. In addition, when the generator is configured by a fuel cell, wastewater is generated during power generation. However, when the place where the driving of the electric vehicle is ended is a place where noise generation and drainage are not allowed, it is not preferable to perform the correction control when the ignition switch is turned off. In addition, the correction control may not be ended until the next driving of the electric vehicle is started after the electric vehicle is stopped to end the driving.

SUMMARY

Therefore, it is an object of the disclosure to provide a battery management device capable of appropriately performing correction control of the SOC of a battery of an electric vehicle.

A battery management device according to an aspect of the disclosure is a battery management device configured to manage a battery in an electric vehicle including the battery, a generator, and a motor. The battery management device includes: a first switch state acquisition unit configured to acquire a state of a first switch, the first switch being turned on to start an ECU of the electric vehicle; a determination unit configured to determine to perform correction control for correcting an error in an SOC of the battery by controlling the SOC of the battery to a predetermined state with electric power generated by the generator when the generator of the electric vehicle is in an operable state and the first switch is operated from ON to OFF; a correction control unit configured to perform the correction control of the SOC of the battery when the determination unit determines that the correction control is to be performed; and a second switch state acquisition unit configured to acquire a state of a second switch for canceling execution of the correction control. When the first switch is operated from ON to OFF while the second switch is ON, the determination unit is configured to determine that the correction control is not to be performed.

In the battery management device, the execution of the correction control of the SOC of the battery stands by when the first switch is ON, and the correction control is performed when the first switch is operated from ON to OFF. Then, when the second switch is ON, the correction control is not performed even if the first switch is turned off. Therefore, by turning on the second switch when it is not appropriate to perform the correction control, the correction control cannot be performed. As a result, it is possible to appropriately perform the SOC correction control.

In addition, the battery management device according to the aspect of the disclosure may further include: a learning unit configured to acquire position information, which indicates a position where the electric vehicle is located when the second switch is turned on, as cancel position information and learns the cancel position information. The determination unit may be configured to determine that the correction control is not to be performed when the first switch is operated from ON to OFF when the electric vehicle is located within a predetermined range associated with the cancel position information learned by the learning unit.

According to the battery management device, by learning the cancel position information, the position information indicating the place where it is not appropriate to perform the correction control is learned. Then, when the electric vehicle is located within the predetermined range associated with the learned cancel position information, the correction control is not performed even if the first switch is turned off. As a result, it is possible to perform control so that the correction control is not performed in a place where it is not appropriate to perform the correction control.

In addition, in the battery management device according to the aspect of the disclosure, the determination unit may be configured to determine that the correction control is to be performed when the first switch is operated from ON to OFF when the second switch is turned off after being turned on.

According to the battery management device, by turning off the second switch after being turned on, it is possible to return to the standby state for performing the correction control. Therefore, when it becomes possible to perform the correction control, the correction control can be performed.

In addition, in the battery management device according to the aspect of the disclosure, when the first switch is operated from ON to OFF when the number of times in a predetermined period by which it has been determined that the correction control is not to be performed due to the second switch being turned on exceeds a predetermined number of times, the determination unit may be configured to determine that the correction control is to be performed regardless of the state of the second switch.

When the number of times by which it has been determined that the correction control is not to be performed due to the second switch being turned on exceeds the predetermined number of times, the possibility that the error in the estimated value of the SOC is considerably large is high. In such a case, according to the battery management device, when the first switch is turned off, the correction control is performed regardless of the state of the second switch. Therefore, it is possible to appropriately correct the SOC.

In addition, the battery management device according to the aspect of the disclosure may further include: a third switch state acquisition unit configured to acquire a state of the third switch, the third switch being a switch for starting driving of the electric vehicle after the electric vehicle is started by the first switch and being able to be turned on only when the first switch is ON. The determination unit may be configured to determine that the correction control is to be stopped when the third switch is turned on while the correction control is being performed.

According to the battery management device, since the correction control is stopped when the third switch for starting the driving of the electric vehicle is turned on, the driving of the electric vehicle can be started even if the correction control is started once.

In addition, the battery management device according to the aspect of the disclosure may further include an information output unit configured to output information regarding execution of the correction control in a manner recognizable by at least one of visual and auditory senses.

According to the battery management device, a user including a driver who drives the electric vehicle and a maintenance person who maintains the electric vehicle can recognize the information regarding the execution of the correction control.

In addition, in the battery management device according to the aspect of the disclosure, when the second switch is turned on when the number of times in a predetermined period by which it has been determined that the correction control is not to be performed due to the second switch being turned on exceeds a predetermined number of times, the information output unit may be configured to output a notification prompting the second switch to be turned off.

According to the battery management device, when the number of times by which it has been determined that the correction control is not to be performed due to the second switch being turned on exceeds the predetermined number of times, the possibility that the error in the estimated value of the SOC is considerably large is high. In such a case, according to the battery management device, since return to the standby state for performing the correction control is prompted by turning off the second switch, it is possible to perform appropriate correction control.

In addition, in the battery management device according to the aspect of the disclosure, the information output unit may be configured to output information indicating that the correction control is performed when the first switch is turned off.

According to the battery management device, the user can recognize that the state is a standby state in which the correction control is performed by turning off the first switch. Therefore, it is possible to prompt the user to consider whether the correction control is not to be performed by operating the second switch.

In addition, in the battery management device according to the aspect of the disclosure, the information output unit may be configured to output information indicating a time required for the correction control.

According to the battery management device, the user can recognize the scheduled end time of the correction control. Therefore, it is possible to provide the user with a material for determining whether the correction control is not to be performed by operating the second switch.

In addition, in the battery management device according to the aspect of the disclosure, the information output unit may be configured to cause a terminal wirelessly communicable with the battery management device to display the time required for the correction control.

According to the battery management device, the user located away from the electric vehicle can recognize the remaining time required for the correction control. Therefore, it is possible to provide the user located away from the electric vehicle with a material for determining whether the correction control is not to be performed by operating the second switch.

In addition, in the battery management device according to the aspect of the disclosure, the information output unit may be configured to output information indicating a remaining time required for the correction control when the first switch is turned while the correction control is being performed.

According to the battery management device, before the driving of the electric vehicle is started, the user can recognize the remaining time required for the correction control before the correction control is stopped. Therefore, it is possible to provide the user with a material for determining whether or not the correction control needs to be stopped.

In addition, in the battery management device according to the aspect of the disclosure, the information output unit may be configured to output information indicating that the correction control is being performed by using at least one of an operation of a cooling fan for cooling a part of the electric vehicle and sounding of a speaker.

According to the battery management device, the user can recognize that the correction control of the SOC is being performed. Therefore, it is possible to prevent problems caused by, for example, maintenance being performed during the correction control.

According to the disclosure, it is possible to provide a battery management device capable of appropriately performing correction control of the SOC of the battery of the electric vehicle.

DETAILED DESCRIPTION

Figure 1:
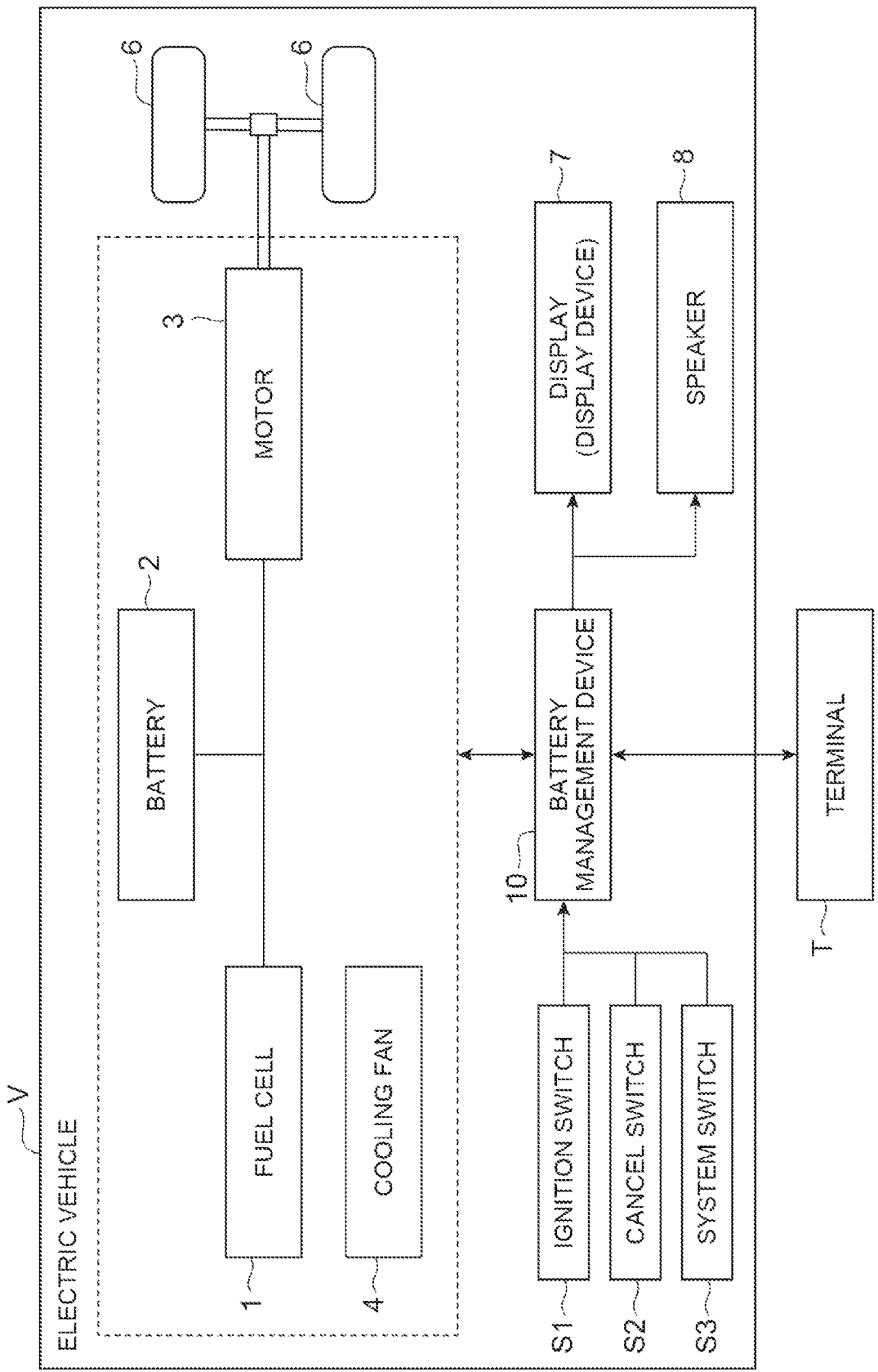
FIG. 1 is a schematic diagram showing the configuration of an electric vehicle in which a battery management device according to an embodiment of the disclosure is mounted.

Hereinafter, an embodiment of the disclosure will be described in detail with reference to the diagrams. In addition, in the following description, the same or equivalent elements are denoted by the same reference numerals, and repeated description thereof will be omitted.

FIG. 1 is a schematic diagram showing the configuration of an electric vehicle in which a battery management device according to an embodiment is mounted. As shown in FIG. 1, a battery management device 10 is mounted in an electric vehicle V. The electric vehicle V includes a fuel cell 1 (generator), a battery 2, and a motor 3.

The fuel cell 1 includes a fuel cell stack (FC stack) that generates electric power. The electric vehicle V travels on the electric power generated by the fuel cell 1. In addition, the electric power generated by the fuel cell 1 is used for charging the battery 2. Since the fuel cell 1 configured as an FC stack generates water during power generation, the water needs to be drained. In addition, the fuel cell 1 emits a sound during power generation. Instead of the fuel cell, the electric vehicle V may include an engine as a generator.

The battery 2 stores the electric power generated by the fuel cell 1. In addition, the battery 2 can also store the electric power generated by the regenerative brake or the like provided in the electric vehicle V. In the present embodiment, the battery 2 is, for example, a lithium ion battery using lithium iron phosphate.

For example, in the battery 2 that is a lithium-ion battery using lithium iron phosphate, the amount of change in the voltage value (open circuit voltage (OCV)) with respect to the amount of change in the SOC is large in a range where the SOC is near 100% and 0%. Other than this range, the amount of change in the voltage value with respect to the amount of change in the SOC is very small. Therefore, it is difficult to estimate the SOC based on the voltage value in the range other than the range where the SOC is near 100% and 0%. For this reason, the battery management device 10 according to the present embodiment fully charges the battery 2 so that the SOC of the battery 2 is close to 100%, as correction control for correcting the error in the SOC. That is, the battery management device 10 according to the present embodiment corrects the estimated value of the SOC by acquiring the voltage value when the SOC is near 100% and acquiring the SOC corresponding to the acquired voltage value.

The motor 3 is operated by the output power of at least one of the fuel cell 1 and the battery 2. The motor 3 drives wheels 6 provided in the electric vehicle V so that the electric vehicle V travels.

The electric vehicle V includes an ignition switch S1, a cancel switch S2, and a system switch S3 that can be operated by the driver of the electric vehicle V.

The ignition switch S1 is a switch for starting an electronic control unit (ECU) 100 of the electric vehicle V when turned on. The cancel switch S2 is a switch for canceling the execution of the correction control. The system switch S3 is a switch for enabling the driving by putting the system of the electric vehicle V into an operating state after the electric vehicle V is started by the ignition switch S1. The system switch S3 can be turned on only when the ignition switch S1 is ON.

In addition, the electric vehicle V may include a cooling fan 4. The cooling fan 4 cools a part of the electric vehicle V and emits a sound during operation.

In addition, the electric vehicle V may include a display 7 (display device) and a speaker 8. The battery management device 10 outputs various kinds of information through the display 7 and the speaker 8, so that the user can visually and audibly recognize the output information. In the present embodiment, the battery management device 10 outputs information regarding the execution of correction control through the display 7 or the speaker 8.

In addition, the battery management device 10 may be configured to be wirelessly communicable with a terminal T. The terminal T is a device operated by a user including a driver, a maintenance person, and the like. The terminal T displays information transmitted from the battery management device 10 on the display of the terminal T, so that the user can recognize the information. In addition, the terminal T outputs the information transmitted from the battery management device 10 as voice, so that the user can recognize the information.

Figure 2:
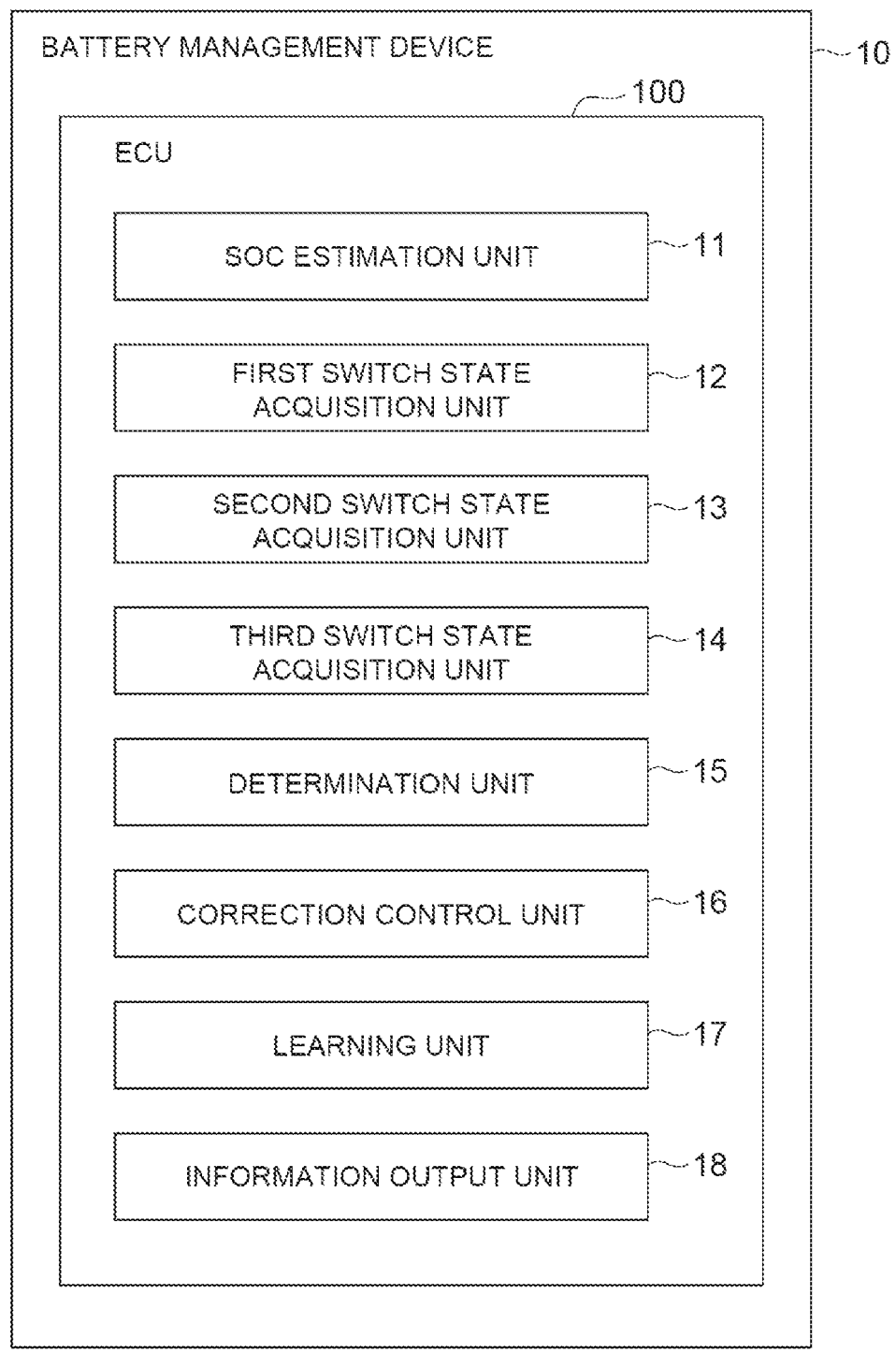
FIG. 2 is a functional block diagram showing the functional configuration of the battery management device.

FIG. 2 is a functional block diagram showing the functional configuration of the battery management device 10. The battery management device 10 manages the battery 2. In the present embodiment, the battery management device 10 can manage the state of charge (SOC) of the battery 2. The SOC of the battery 2 managed by the battery management device 10 is used for various controls in the electric vehicle V, for example, control of the motor 3.

The battery management device 10 includes the ECU 100. The ECU 100 is an electronic control unit including a CPU, a ROM, a RAM, and the like. The ECU 100 realizes various functions by, for example, loading a program recorded in the ROM into the RAM and executing the program loaded into the RAM by the CPU. The ECU 100 may be configured to include a plurality of electronic units.

As shown in FIG. 2, functionally, the battery management device 10 includes an SOC estimation unit 11, a first switch state acquisition unit 12, a second switch state acquisition unit 13, a third switch state acquisition unit 14, a determination unit 15, a correction control unit 16, a learning unit 17, and an information output unit 18.

The SOC estimation unit 11 estimates the SOC of the battery 2 based on the usage status of the battery 2. As described above, it is difficult to estimate the SOC of the battery 2 from the voltage value based on the correlation between the voltage value of the battery 2 and the SOC when the SOC is not near 100% and 0%. Therefore, the SOC estimation unit 11 estimates the SOC of the battery 2 based on the integrated value of the current values during charging and discharging by using the current integration method, for example.

When the SOC estimation unit 11 estimates the SOC by using the current integration method, an error occurs between the estimated SOC and the actual SOC of the battery 2 due to the current value measurement error or the like. Therefore, the SOC estimation unit 11 corrects the estimated SOC at a predetermined timing. That is, as will be described in detail later, the correction control unit 16 fully charges the battery 2 so that the SOC of the battery 2 is close to 100%, as correction control, and the SOC estimation unit 11 corrects the estimated value of the SOC by acquiring the voltage value when the SOC is near 100% and acquiring the SOC corresponding to the acquired voltage value.

The first switch state acquisition unit 12 acquires the state of the first switch. In the present embodiment, the first switch is, for example, the ignition switch S1 (ignition SW, IG-SW).

The second switch state acquisition unit 13 acquires the state of the second switch. In the present embodiment, the second switch is the cancel switch S2 (cancel SW).

The third switch state acquisition unit 14 acquires the state of the third switch. In the present embodiment, the third switch is the system switch S3 (system SW, ST-SW).

When the ignition switch S1 is operated from ON to OFF, the determination unit 15 determines that correction control for correcting the error in the SOC of the battery 2 is to be performed by controlling the SOC of the battery 2 to a predetermined state (near 100%, fully charged) with the electric power generated by the fuel cell 1. Specifically, the determination unit 15 determines that the SOC correction control is to be performed when the system of the electric vehicle V is in the operating state (state in which the generator can be operated) and the ignition switch S1 is operated from ON to OFF. More specifically, the determination unit 15 determines various controls including the execution of correction control by managing the mode transition in the battery management device 10. The mode transition management by the determination unit 15 and various controls based on the mode will be described later with reference to FIG. 3.

The correction control unit 16 performs correction control of the SOC of the battery when the determination unit 15 determines that the correction control is to be performed. That is, the correction control unit 16 performs correction control so that the SOC of the battery 2 is close to 100% by causing the fuel cell 1 to generate electric power based on the determination of the determination unit 15.

The learning unit 17 acquires position information indicating the position where the electric vehicle V is located when a cancel operation in which the cancel switch S2 is turned on is performed, as cancel position information, for example, from a GPS device provided in the electric vehicle V, and stores the position information and learns the cancel position information.

The information output unit 18 outputs information regarding the execution of the correction control in a manner recognizable by at least one of visual and auditory senses. Specifically, the information output unit 18 outputs the information regarding the execution of the correction control in a manner recognizable by the user's eyes by displaying the information regarding the execution of the correction control on the display 7. In addition, the information output unit 18 outputs the information regarding the execution of the correction control in a manner recognizable by the user's hearing by outputting the information regarding the execution of the correction control as voice from the speaker 8. In addition, the learning unit 17 and the information output unit 18 are non-essential functional elements in the battery management device 10 according to the present embodiment.

Figure 3:
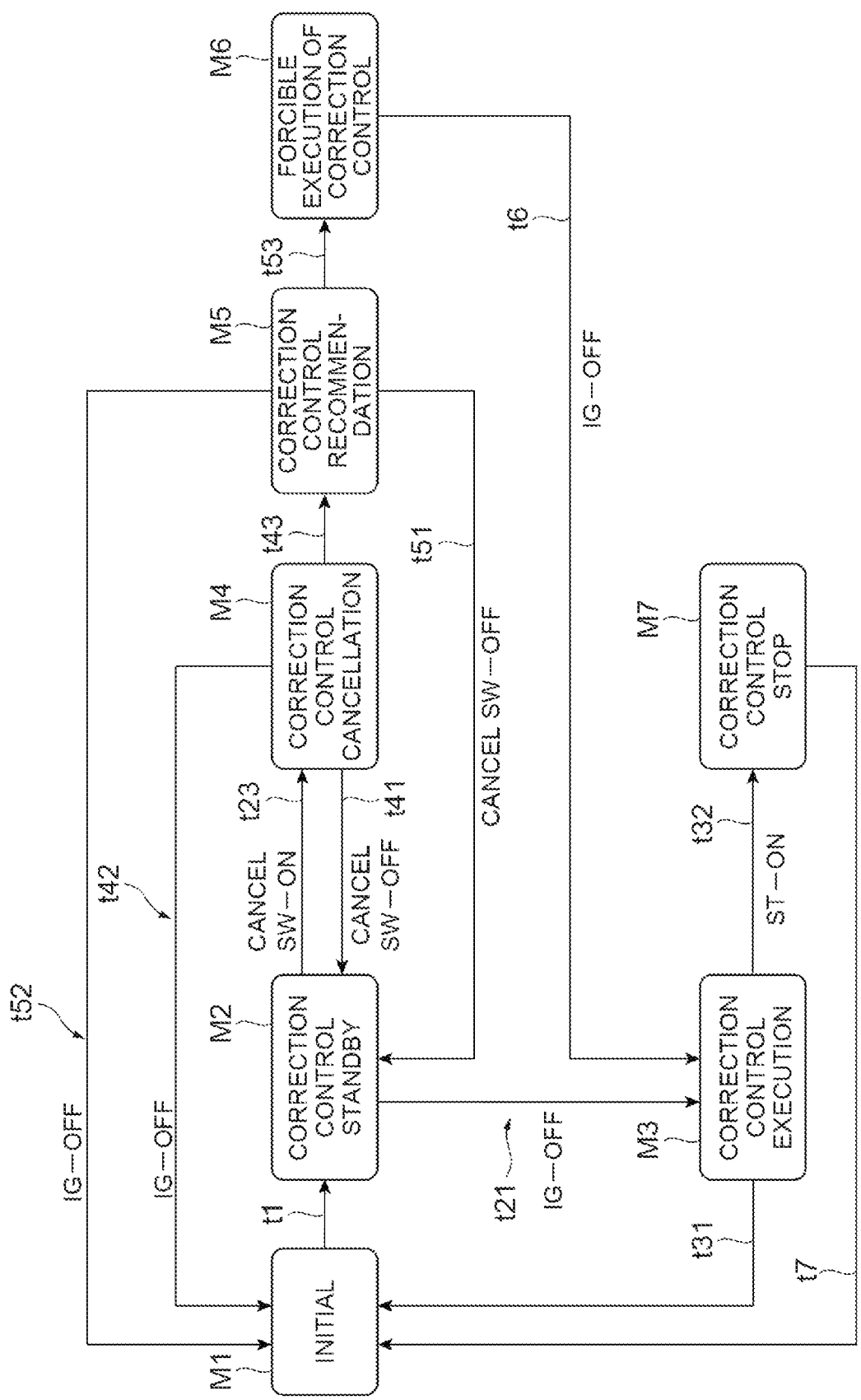
FIG. 3 is a transition diagram showing a mode (state) transition for battery management in the battery management device.

FIG. 3 is a transition diagram showing a mode (state) transition for battery management in the battery management device 10. First, the determination unit 15 manages the battery management device 10 in a mode M1, which is an initial state. In the mode M1, for example, when management to perform correction control when the ignition switch S1 is turned off is explicitly or implicitly (by default) set (t1), the determination unit 15 shifts the mode to a mode M2, which is a correction control standby state. In addition, the determination unit 15 may shift the mode from the mode M1 to the mode M2 when the ignition switch S1 is turned on.

In the mode M2, the information output unit 18 outputs information, which indicates that the correction control is performed when the ignition switch S1 is turned off, through at least one of the display 7 and the speaker 8. In addition, in the mode M2, the information output unit 18 may further output information indicating the time required for the correction control. The time required for the correction control is calculated, as the time required for the battery 2 to be fully charged, based on the SOC estimated by the SOC estimation unit 11.

In the mode M2, the determination unit 15 determines that the correction control is to be performed when the ignition switch S1 is operated from ON to OFF. That is, in the mode M2, when the ignition switch S1 is turned off (IG-OFF, t21), the determination unit 15 shifts the mode to a mode M3, which is a state in which the correction control is performed. In the mode M3, the correction control unit 16 performs the SOC correction control. Specifically, when the mode is shifted from the mode M2 to the mode M3, the correction control unit 16 performs the correction control while maintaining the system of the electric vehicle V in the operating state for the operation of the fuel cell 1 that is an example of the generator. The determination unit 15 shifts the mode from the mode M3 to the mode M1 when the correction control ends in the mode M3.

In the mode M2, when the cancel switch S2 is turned on (t23, cancel SW-ON), the determination unit 15 shifts the mode to a mode M4, which is a state in which the correction control is canceled.

In the mode M4, the battery management device 10 performs management so that the correction control is not performed even if the ignition switch S1 is operated from ON to OFF. That is, in the mode M4, when the ignition switch S1 is turned off (t42, IG-OFF), the determination unit 15 shifts the mode from the mode M4 to the mode M1.

As described above, when the cancel switch S2 is ON, the correction control is not performed even if the ignition switch S1 is turned off. Therefore, by turning on the cancel switch S2 when it is not appropriate to perform the correction control, the correction control cannot be performed. As a result, it is possible to appropriately perform the SOC correction control.

In addition, when the cancel position information indicating the position where the electric vehicle V is located when the cancel operation is performed is acquired and stored by the learning unit 17, in the mode M2, the determination unit 15 may determine that the correction control is not to be performed by shifting the mode to the mode M4 when the ignition switch S1 is operated from ON to OFF (t23) when the electric vehicle V is located within a predetermined range associated with the cancel position information (for example, a position within a predetermined distance from the cancel position). In addition, when the frequency at which the cancel operation is performed at a predetermined position is equal to or higher than a predetermined frequency, the learning unit 17 may learn the position as the cancel position information.

Thus, by learning the cancel position information, the position information indicating the place where it is not appropriate to perform the correction control is learned. Then, when the electric vehicle is located within the predetermined range associated with the learned cancel position information, the correction control is not performed even if the ignition switch S1 is turned off. As a result, it is possible to perform control so that the correction control is not performed in a place where it is not appropriate to perform the correction control.

In the mode M4, the determination unit 15 determines that the correction control is to be performed when the ignition switch S1 is operated from ON to OFF when the cancel switch S2 is operated from ON to OFF. That is, in the mode M4, when the cancel switch S2 is turned off (cancel SW-OFF, t41), the determination unit 15 shifts the mode to the mode M2, which is a correction control standby state.

Thus, by turning off the cancel switch S2 after being turned on, it is possible to return to the standby state for performing the correction control. Therefore, when it becomes possible to perform the correction control, the correction control can be performed.

In the mode M4, when the number of times in a predetermined period by which it has been determined that the correction control is not to be performed due to the cancel switch S2 being turned on (t23) exceeds a predetermined number of times, the determination unit 15 shifts the mode to a mode M5, which is a correction control recommendation state (t43). In the mode M5, the information output unit 18 outputs a notification prompting the cancel switch S2 to be turned off through the display 7 or the speaker 8.

As described above, when the number of times by which it has been determined that the correction control is not to be performed due to the cancel switch S2 being turned on exceeds the predetermined number of times, the possibility that the error in the estimated value of the SOC is considerably large is high. In such a case, since return to the standby state for performing the correction control is prompted by turning off the cancel switch S2, it is possible to perform appropriate correction control.

In the mode M5, when the cancel switch S2 is turned off in response to the notification prompting the cancel switch S2 to be turned off (cancel SW-OFF, t51), the determination unit 15 shifts the mode to the mode M2. In addition, in the mode M5, when the ignition switch S1 is turned off (IG-OFF, t52), the determination unit 15 shifts the mode to the mode M1.

In the mode M5 (or the mode M4), when the ignition switch S1 is operated from ON to OFF (t53) when the number of times in a predetermined period by which it has been determined that the correction control is not to be performed due to the cancel switch S2 being turned on exceeds the predetermined number of times (for example, the number of times larger than the predetermined number of times of the condition of the mode transition t43), the determination unit 15 determines that the correction control is to be performed regardless of the state of the cancel switch S2. That is, in the mode M5, when the ignition switch S1 is operated from ON to OFF when the number of times in the predetermined period by which it has been determined that the correction control is not to be performed exceeds the predetermined number of times, the determination unit 15 shifts the mode to a mode M6, which is a state in which the correction control is forcibly performed. In the mode M5, when the number of times in a predetermined period by which the mode has been shifted from the mode M4 to the mode M5 exceeds a predetermined number of times, the determination unit 15 may shift the mode to the mode M6.

In the mode M6, when the ignition switch S1 is turned off (IG-OFF, t6) the determination unit 15 shifts the mode to the mode M3 regardless of the state of the cancel switch S2. By shifting the mode to the mode M3, the SOC correction control is forcibly performed. Specifically, when the mode is shifted from the mode M6 to the mode M3, the correction control unit 16 performs the correction control while maintaining the system of the electric vehicle V in the operating state for the operation of the fuel cell 1 that is an example of the generator.

In the mode M3, the correction control unit 16 performs the SOC correction control. In the mode M3, the determination unit 15 determines that the correction control is to be stopped when the system switch S3 is turned on while the correction control is being performed. That is, in the mode M3, when the system switch S3 is turned on, the determination unit 15 shifts the mode to a mode M7, which is a state in which the correction control is stopped (t32). That is, when the driver explicitly inputs an instruction to operate the system of the electric vehicle V, the correction control unit 16 stops the correction control. In the mode M7, after the control for stopping the correction control is completed, the determination unit 15 shifts the mode to the mode M1 (t7). In addition, in the mode M3, when the SOC correction control ends, the determination unit 15 shifts the mode to the mode M1 (t31).

As described above, since the correction control is stopped when the system switch S3 for starting the driving of the electric vehicle V is turned on, the driving of the electric vehicle V can be started even if the correction control is started once.

Next, the output of information in each mode will be described. In the mode M2, the information output unit 18 outputs information, which indicates that the correction control is performed (the mode is shifted to the mode M3) when the ignition switch S1 is turned off, through the display 7 or the speaker 8. In addition, when the correction control is to be performed, the information output unit 18 may also output information indicating the time required for the correction control. By outputting such information, the user can recognize that the correction control is in a standby state and recognize the time required for the correction control. Therefore, it is possible to prompt the user to consider whether the correction control is not to be performed by operating the cancel switch S2.

In addition, the time required for the correction control may be a predetermined time set in advance. In addition, the time required for the correction control may be determined based on preset information in which the SOC value and the time required for the correction control are associated with each other. That is, the information output unit 18 can acquire the time required for the correction control based on the SOC value estimated by the SOC estimation unit 11.

In the mode M3, the information output unit 18 outputs information, which indicates the time required for the correction control being performed, through the display 7 or the speaker 8. Therefore, since the user can recognize the time required for the correction control, the user can determine, for example, whether or not the correction control is to be ended until the next driving of the electric vehicle V.

In addition, in the mode M3, the information output unit 18 may transmit information, which indicates the time required for the correction control being performed, to the terminal T and display the transmitted information on the display of the terminal T or output the transmitted information as voice. Therefore, the user located away from the electric vehicle V can recognize the time required for the correction control.

In the mode M3, the information output unit 18 may cause the cooling fan 4 to operate or the speaker 8 to emit sound while the correction control is being performed. Thus, by generating sound from the cooling fan 4 or the speaker 8, the user (including the driver and the maintenance person) can recognize that the correction control is being performed. Therefore, it is possible to prevent problems caused by, for example, maintenance being performed during the correction control.

In the mode M3, the information output unit 18 may output information indicating the remaining time, which is required for the correction control, through the display 7 or the speaker 8 when the ignition switch S1 is turned on. The ignition switch S1 is turned on before turning on the system switch S3 for starting the driving of the electric vehicle V. Therefore, the user can recognize the remaining time required for the correction control before the correction control is stopped by shifting the mode from the mode M3 to the mode M7. As a result, it is possible to provide the user with a material for determining whether or not the correction control needs to be stopped.

As described above, in the battery management device 10 according to the present embodiment, the execution of the correction control of the SOC of the battery stands by when the ignition switch S1 is ON, and the correction control is performed when the ignition switch S1 is operated from ON to OFF. Then, when the cancel switch S2 is ON, the correction control is not performed even if the ignition switch S1 is turned off. Therefore, by turning on the cancel switch S2 when it is not appropriate to perform the correction control, the correction control cannot be performed. As a result, it is possible to appropriately perform the SOC correction control.

Until now, the disclosure has been described in detail based on the embodiment. However, the disclosure is not limited to the embodiment described above. The disclosure can be modified in various ways without departing from its gist.

REFERENCE SIGNS LIST

1: fuel cell, 2: battery, 3: motor, 4: cooling fan, 6: wheel, 7: display, 8: speaker, 10: battery management device, 11: SOC estimation unit, 12: first switch state acquisition unit, 13: second switch state acquisition unit, 14: third switch state acquisition unit, 15: determination unit, 16: correction control unit, 17: learning unit, 18: information output unit, S1: ignition switch, S2: cancel switch, S3: system switch, T: terminal, V: electric vehicle.

What is claimed is:

1. A battery management device configured to manage a battery in an electric vehicle including the battery, a generator, and a motor, comprising:
    a first switch state acquisition unit configured to acquire a state of a first switch, the first switch being turned on to start the electric vehicle;
    a determination unit configured to determine to perform correction control for correcting an error in a state of charge (SOC) of the battery by controlling the SOC of the battery to a predetermined state with electric power generated by the generator when the generator of the electric vehicle is in an operable state and the first switch is operated from ON to OFF;
    a correction control unit configured to perform the correction control of the SOC of the battery when the determination unit determines that the correction control is to be performed; and
    a second switch state acquisition unit configured to acquire a state of a second switch for canceling execution of the correction control,
    wherein, when the first switch is operated from ON to OFF while the second switch is ON, the determination unit is configured to determine that the correction control is not to be performed.

2. The battery management device according to claim 1, further comprising:
    a learning unit configured to acquire position information, which indicates a position where the electric vehicle is located when the second switch is turned on, as cancel position information and learns the cancel position information,
    wherein the determination unit is configured to determine that the correction control is not to be performed when the first switch is operated from ON to OFF when the electric vehicle is located within a predetermined range associated with the cancel position information learned by the learning unit.

3. The battery management device according to claim 1, wherein the determination unit is configured to determine that the correction control is to be performed when the first switch is operated from ON to OFF when the second switch is turned off after being turned on.

4. The battery management device according to claim 1, wherein, when the first switch is operated from ON to OFF when the number of times in a predetermined period by which it has been determined that the correction control is not to be performed due to the second switch being turned on exceeds a predetermined number of times, the determination unit is configured to determine that the correction control is to be performed regardless of the state of the second switch.

5. The battery management device according to claim 1, further comprising:
    a third switch state acquisition unit configured to acquire a state of a third switch, the third switch being a switch for starting driving of the electric vehicle after the electric vehicle is started by the first switch and being able to be turned on only when the first switch is ON,
    wherein the determination unit is configured to determine that the correction control is to be stopped when the third switch is turned on while the correction control is being performed.

6. The battery management device according to claim 1, further comprising:
    an information output unit configured to output information regarding execution of the correction control in a manner recognizable by at least one of visual and auditory senses.

7. The battery management device according to claim 6, wherein, when the second switch is turned on when the number of times in a predetermined period by which it has been determined that the correction control is not to be performed due to the second switch being turned on exceeds a predetermined number of times, the information output unit is configured to output a notification prompting the second switch to be turned off.

8. The battery management device according to claim 6, wherein the information output unit is configured to output information indicating that the correction control is performed when the first switch is turned off.

9. The battery management device according to claim 6, wherein the information output unit is configured to output information indicating a time required for the correction control.

10. The battery management device according to claim 9, wherein the information output unit is configured to cause a terminal wirelessly communicable with the battery management device to display the time required for the correction control.

11. The battery management device according to claim 6, wherein the information output unit is configured to output information indicating a remaining time required for the correction control when the first switch is turned while the correction control is being performed.

12. The battery management device according to claim 6, wherein the information output unit is configured to output information indicating that the correction control is being performed by using at least one of an operation of a cooling fan for cooling a part of the electric vehicle and sounding of a speaker.

* * * * *